United States Patent
Csaky-Pallavicini et al.

(10) Patent No.: US 11,761,605 B2
(45) Date of Patent: Sep. 19, 2023

(54) VEHICLE HEADLAMP MODULE

(71) Applicant: ZKW Group GmbH, Wieselburg (AT)

(72) Inventors: Carl Csaky-Pallavicini, Baden (AT); Dominic Seibert, Neunkirchen (AT)

(73) Assignee: ZKW Group GmbH, Wieselburg (AT)

( * ) Notice: Subject to any disclaimer, the term of this patent is extended or adjusted under 35 U.S.C. 154(b) by 0 days.

(21) Appl. No.: 18/086,012

(22) Filed: Dec. 21, 2022

(65) Prior Publication Data
US 2023/0204185 A1    Jun. 29, 2023

(30) Foreign Application Priority Data
Dec. 28, 2021 (EP) .................................... 21217902

(51) Int. Cl.
  *F21S 45/10*   (2018.01)
  *F21S 41/25*   (2018.01)
  *F21S 41/141*  (2018.01)

(52) U.S. Cl.
  CPC ............ *F21S 45/10* (2018.01); *F21S 41/141* (2018.01); *F21S 41/25* (2018.01)

(58) Field of Classification Search
  None
  See application file for complete search history.

(56) References Cited

U.S. PATENT DOCUMENTS

2005/0174748 A1  8/2005  Kojima
2010/0271791 A1  10/2010 Loibl et al.

FOREIGN PATENT DOCUMENTS

DE   102009060780 A1   6/2011

OTHER PUBLICATIONS

Search Report for European Patent Application No. 21217902.2, dated Sep. 9, 2022 (5 pages).

*Primary Examiner* — Elmito Breval
(74) *Attorney, Agent, or Firm* — Eversheds Sutherland (US) LLP

(57) ABSTRACT

A vehicle headlamp module, including an electrical circuit arrangement for controlling at least one function of a vehicle headlamp, and a housing for at least partially accommodating the electrical circuit arrangement, wherein the housing at least in certain sections has a metallic electrically conductive shielding surface facing the circuit arrangement for electromagnetically shielding the circuit arrangement. The electrical circuit arrangement has at least one contact-sensitive surface section that is constructed in a substantially planar manner, is free from electrical components arranged thereon, and faces a planar section of the shielding surface of the housing. Electrical conductor tracks and/or contacts run along the contact-sensitive surface section, wherein a number of cured electrically non-conductive adhesive dots is arranged on the contact-sensitive surface section that is constructed in a substantially planar manner, which protrude from the contact-sensitive surface section in the direction of the planar section of the shielding surface of the housing to ensure a minimum spacing between the contact-sensitive surface section and the planar section of the shielding surface of the housing.

15 Claims, 4 Drawing Sheets

VEHICLE HEADLAMP MODULE

CROSS-REFERENCE TO RELATED APPLICATIONS

This application claims priority to European Patent Application No. 21217902.2, filed Dec. 28, 2021, which is incorporated herein by reference.

FIELD OF THE INVENTION AND DESCRIPTION OF PRIOR ART

The invention relates to a vehicle headlamp module, comprising an electrical circuit arrangement for controlling at least one function of a vehicle headlamp and a housing for at least partially accommodating the electrical circuit arrangement, the housing at least in certain sections having a metallic electrically conductive shielding surface facing the circuit arrangement for electromagnetically shielding the circuit arrangement, the electrical circuit arrangement having at least one contact-sensitive surface section that is constructed in a substantially planar manner, this contact-sensitive surface section being free from electrical components arranged thereon and facing a planar section of the shielding surface of the housing, electrical conductor tracks and/or contacts running along the contact-sensitive surface section.

SUMMARY OF THE INVENTION

The installation of the circuit arrangement in the vehicle headlamp module should generally take place in as space-saving a manner as possible. To electromagnetically shield circuit arrangements, it is conventional to surround the same at least in certain sections with an electrically conductive housing. In the prior art, there is the problem in this case that the circuit arrangement cannot be moved arbitrarily close to the electrically conductive housing, as otherwise there is the danger of the occurrence of electrical short circuits due to surface contact with an electrically conductive surface. Although the application of an insulating varnish layer onto surfaces of circuit arrangements is sufficiently well known and suitable for preventing a short circuit in the event of surface contact with an electrically conductive surface, there is the additional problem in the case of use in vehicle applications, that vehicle headlamp modules are often exposed to mechanical influences such as vibrations and shocks during driving, which may lead to abrading of an insulating layer covering electrical contact regions or conductor tracks. Short circuits may occur as a consequence of that. The existence of manufacturing tolerances and installation tolerances causes positional inaccuracies of the location of the circuit arrangement and the housing, so that it is required, even during the planning of a vehicle headlamp module, to calculate in a buffer when choosing the minimum safe distance of the circuit arrangement from the surrounding electrically conductive housing or shielding element, in order to avoid the occurrence of short circuits as a consequence of undesired housing contact.

It is therefore an object of the invention to create a vehicle headlamp module, which enables a space-saving design with still high operational reliability. This object is achieved by a vehicle headlamp module of the type mentioned at the beginning, in which according to the invention, a number of cured electrically non-conductive adhesive dots is arranged on the contact-sensitive surface section that is constructed in a substantially planar manner, which protrude from the contact-sensitive surface section in the direction of the planar section of the shielding surface of the housing to ensure a minimum spacing between the contact-sensitive surface section and the planar section of the shielding surface of the housing. In this manner, the contact-sensitive surface section is prevented from rubbing against the planar section of the shielding surface, even if the circuit arrangement is arranged so close to the shielding surface that the adhesive dots contact the same at least from time to time. As a result, the invention enables a particularly space-saving design with consistently high operational reliability.

The cured adhesive dots can be placed onto the circuit arrangement during the conventional mounting process (typically in terms of SMT technology) and can cure e.g. during and/or even before a soldering procedure is carried out in what is known as a reflow soldering furnace.

Adhesive material and devices for placing adhesive dots are often available in a mounting process of circuit arrangements for vehicle modules, specifically in order to fix position-critical components such as LED light sources in their position for example, before soldering paste, which is arranged on the circuit arrangement and on which the position-critical components sit after the mounting, is melted in a soldering procedure to produce a permanent electrical connection. The adhesive properties of the adhesive dots are therefore relevant to the extent that these dots can be placed onto the circuit arrangement in a simple, dimensionally stable and positionally reliable manner and adhere securely to the circuit arrangement after their curing. After their curing, the adhesive dots act as spacers and typically have a punctiform geometry, as they are dispensed onto the circuit arrangement in a punctiform manner by a dispenser in an assembly process and can thereafter be cured in the course of the SMT soldering procedure in a soldering furnace.

The electrical circuit arrangement is set up to control at least one function of a vehicle headlamp. In this case, that may be e.g. one or more of the following light mentioned light functions: high beam, matrix beam, low beam, parking light, tail lighting, etc. Any desired electrical components that can be used in vehicle headlamp modules can be considered as electrical components. ICs, capacitors, coils, resistors, diodes, etc. are mentioned by way of example. The electrical conductor tracks and/or contacts that are arranged along the contact-sensitive surface section can also be coated by an insulating layer, e.g. by a solder resist coating. The expression "a number of electrically non-conductive adhesive dots is arranged on the contact-sensitive surface section that is constructed in a substantially planar manner" means that the surface section is constructed to be planar such that protruding adhesive dots protrude above the surface section, specifically such that the adhesive dots even protrude above any slight unevennesses in the surface, so that in the event of contact with a parallel oriented planar metallic electrically conductive shielding surface, the adhesive dots contact the metallic electrically conductive shielding surface and as a result space the contact-sensitive surface section from the shielding surface. That is to say, the adhesive dots project from the substantially planar contact-sensitive surface section or they protrude above the same to ensure a minimum spacing. The number of adhesive dots can basically be chosen freely and is in practice optimized for the respective size of the contact-sensitive surface section. A number of at least or exactly two, four, six, ten, twenty or forty adhesive dots is mentioned by way of example. Of course, adhesive dots can also be arranged outside of the planar contact-sensitive surface section or placed beyond the same on the circuit arrangement.

In particular, it may be provided that adjacent adhesive dots are arranged at a desired spacing of between 1.5 mm and 8 mm, particularly between 2 mm and 6 mm, with respect to one another. This spacing is measured from the center of the respective adhesive dots. In this manner, it is ensured that a beneficial number of adhesive dots is arranged per unit area. Furthermore, it may namely be provided that the adhesive dots are distributed substantially uniformly along the contact-sensitive surface section, in that each imaginary circular unit area of the contact-sensitive surface section, which has a diameter amounting to the maximum value of the desired spacing, has at least one adhesive dot. This means that the entire planar surface section, which is contact-sensitive, has adhesive dots or these adhesive dots are distributed on the entire planar surface section.

In particular, it may be provided that the adhesive dots are arranged in rows and columns, wherein the number of rows is between two and four and the number of columns is between eight and sixteen. These rows and columns correspond to straight lines, wherein the columns are preferably oriented orthogonal to the rows and all rows and columns lie within one plane. In this manner, the dispensing of the adhesive dots can be undertaken particularly efficiently.

Furthermore, it may be provided that the height of the adhesive dots is between 0.05 mm and 0.4 mm, particularly between 0.1 mm and 0.25 mm. In particular, it may be provided that the diameter of the adhesive dots in the contact area with the contact-sensitive surface section is between 0.25 mm and 1.5 mm. Preferably, the adhesive dots have a circular shape in this case, specifically as seen from a perspective that is oriented normal to the plane of the surface section. These may be SMT adhesive dots in this case. The ratio of diameter to height of the adhesive dot can be e.g. between 3:1 and 5:1, particularly 4:1, i.e. the diameter is multiple times larger than the height of the adhesive dot. The adhesive dots can also be used as spacers from other elements, such as plates, cooling elements, printed circuit boards, plugs, lids, etc. The circuit substrate can otherwise be screwed into the housing—spacings and positions can even be ensured within a certain tolerance range as a result of this. Preferably, screw connections are combined with adhesive dots, i.e. a region of the circuit arrangement is screwed, while a different region is spaced at a minimum spacing from the surroundings by means of the adhesive dots.

Furthermore, it may be provided that the adhesive dots consist of thermosetting adhesive material. The adhesive with the name "Loctite 3621", which is available commercially e.g. from Henkel Central Eastern Europe GmbH, is mentioned by way of example as a thermosetting adhesive material. The circuit arrangement including the components and adhesive dots arranged thereon can e.g. initially be heated in the course of an SMT process, after mounting and then reach a preheating zone, in which thermosetting adhesive dots can cure for example and soldering paste or solder material does not yet melt, in order advantageously to ensure that the adhesive cures before the solder material loses its holding/adhesive strength. The thermosetting can e.g. take place at a temperature of 150° C. for a duration of e.g. 90 to 120 seconds. After a defined duration, the temperature is rapidly increased, in order to melt the solder material rapidly and permanently to connect the electrical components to associated contact surfaces by melting solder material arranged thereon. After the elapse of a defined duration, the temperature can subsequently be lowered again. The hardening of the adhesive is therefore thermally coupled with the soldering procedure. Thus, it may for example be provided that the hardening temperature is below the melting temperature of the solder connection and the adhesive can be heated in the cured state temporarily at least up to the melting temperature of the solder connection, particularly to a temperature of 250° C., without damage. The expression "heatable without damage" is understood in this case to mean a procedure in which the mechanical, thermal and electrical properties of the adhesive after curing, which takes place below a temperature of 250° C., remain maintained unchanged in spite of temporary heating to 250° C. The duration of the temporary heating is typically a few seconds.

It may in particular be provided that the circuit arrangement is formed by a circuit substrate and electrical components arranged thereon, wherein the contact-sensitive surface section is formed by a surface section of the circuit substrate, wherein the circuit substrate is a semi-flex printed circuit board, which comprises at least three substantially rigid sections, namely two outer sections and an intermediate section, and two flexible bending sections, wherein the two outer sections are connected to the intermediate section by means of a flexible bending section in each case, wherein the adhesive dots are arranged at least on the intermediate section. In this manner, a particularly space-saving arrangement can be achieved by means of bending, particularly folding of the circuit substrate. In this case, the adhesive points do not exclusively have to be arranged on the intermediate section, but rather can also be placed beyond the same as far as in the bending section. A semi-flex printed circuit board is understood to mean a printed circuit board that has flexible and rigid regions. These flexible regions do not necessarily have to be permanently flexible. It may be sufficient for the present invention if the flexible region can be bent at least once after mounting with the electrical components, without the relevant conductor tracks and/or contacts being damaged in the process. It is e.g. sufficient to use an only temporarily flexible region in the printed circuit board, e.g. in order to enable mounting in the case of limited space, there is the approach of tapering a layer stack of a printed circuit board, which is built from a plurality of pre-pregs, down to a few layers by milling or tapering pre-stamped pre-pregs with recessed regions. The tapered region is typically provided with a permanently flexible lacquer coat and can then be bent a few times. The printed circuit board can as a result be formed in one piece in spite of bends by 90° or 180°, as a result of which a space-saving design benefits. Such printed circuit boards are available e.g. from the company "Würth Elektronik GmbH & Co. KG", cf. e.g. www.we-online.de/flex.

Further, it may be provided that at least the intermediate section is arranged opposite the planar section of the shielding surface of the housing.

In particular, it may be provided that an opening is formed between the two outer sections, which extends from the one outer section to the other outer section, wherein the opening is delimited by the outer sections, the laterally adjoining region of the intermediate section and the two flexible bending sections, wherein a further opening is arranged in the shielding surface of the housing, which overlaps at least partially with the opening of the circuit substrate. This opening can e.g. be provided for accommodating a plug or electrical lines fed from outside.

Further, it may be provided that the circuit substrate additionally has a rigid additional outer section and an additional flexible bending section, using which the additional outer section is connected in a flexible manner to one of the outer sections. The bends in the bending sections may be e.g. 90° in each case, wherein roundings with a constant bending radius are preferably provided, in order to avoid critical minima in the bending radius.

In particular, it may be provided that the circuit arrangement comprises light sources, particularly LED light sources, for radiating light. The light sources can be provided to radiate the light distributions corresponding to the aforementioned light functions in cooperation with a downstream projection system.

Further, it may be provided that the contact-sensitive surface section and the planar section of the shielding surface are oriented parallel to one another.

In particular, it may be provided that the spacing between the contact-sensitive surface section and the planar section of the shielding surface is 5 mm maximum. The design is therefore particularly compact.

Further, the invention relates to a vehicle headlamp, particularly a motor vehicle headlamp, comprising a vehicle headlamp module according to the invention and at least one optical projection system for radiating a light distribution.

BRIEF DESCRIPTION OF THE DRAWINGS

The invention is explained in more detail in the following on the basis of an exemplary and non-limiting embodiment, which is shown in the figures. In the figures.

DETAILED DESCRIPTION OF EMBODIMENTS OF THE INVENTION

In the following figures—insofar as not otherwise specified—the same reference numbers label the same features.

Figure 1:
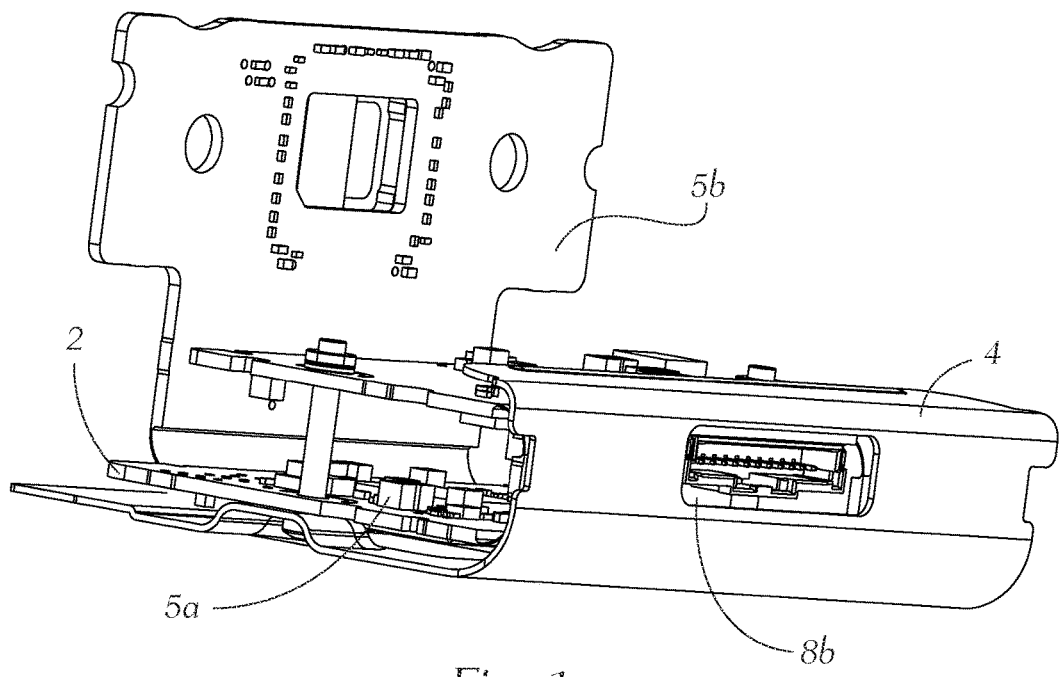
FIG. 1 shows a perspective illustration of a vehicle headlamp module according to the invention.
Figure 3:
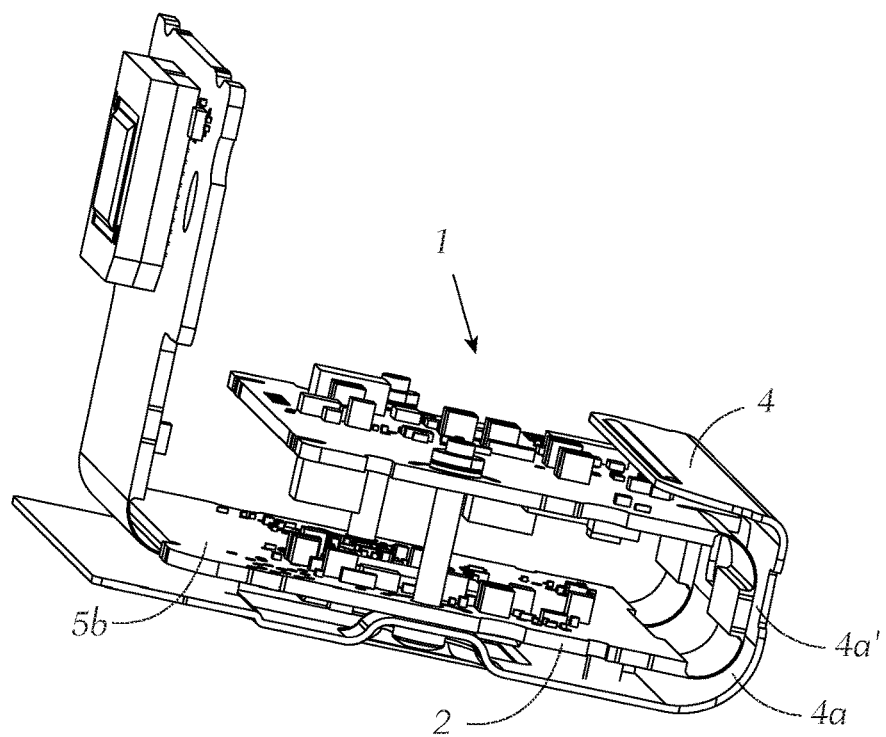
FIG. 3 shows a side view of the vehicle headlamp module according to FIGS. 1 and 2.

FIG. 1 shows a perspective illustration of a vehicle headlamp module 1 according to the invention. The vehicle headlamp module 1 comprises an electrical circuit arrangement 2 for controlling at least one function of a vehicle headlamp 3 and a housing 4 for at least partially accommodating the electrical circuit arrangement 2. The housing 4 at least in certain sections has a metallic electrically conductive shielding surface 4a (cf. FIG. 3) facing the circuit arrangement 2 for electromagnetically shielding the circuit arrangement 2.

Figure 2:
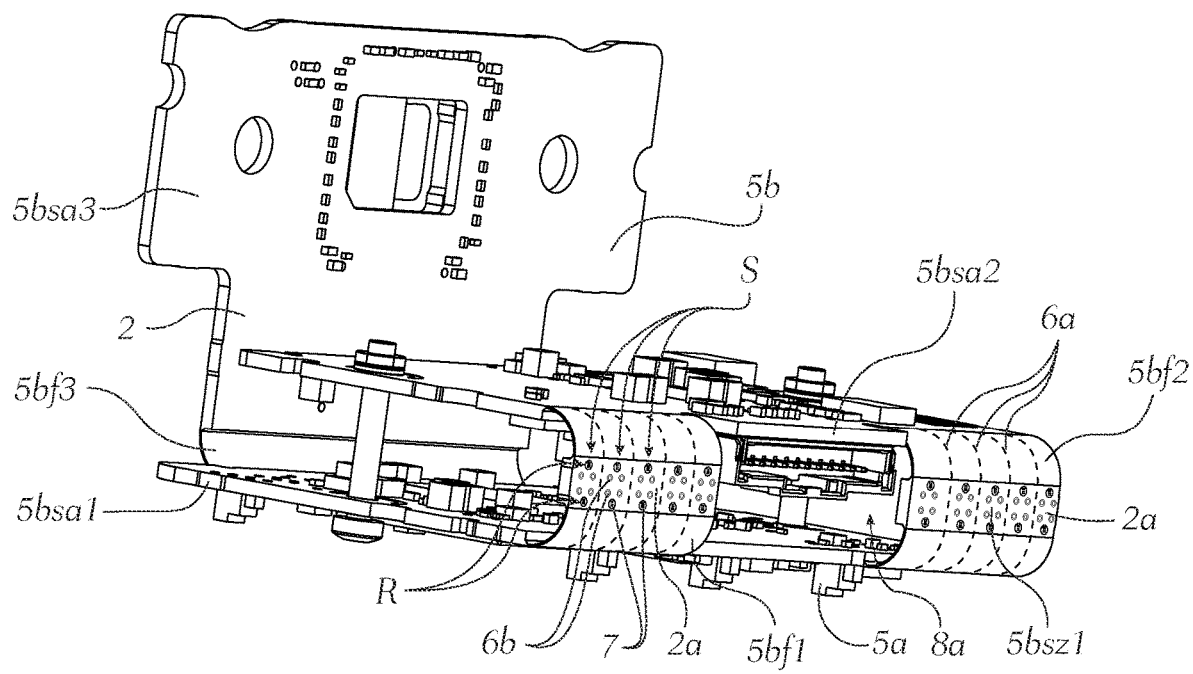
FIG. 2 shows a perspective illustration of the vehicle headlamp module according to FIG. 1, without a housing arranged thereon.

With a view to FIG. 2, it is mentioned that the electrical circuit arrangement 2 has at least one contact-sensitive surface section 2a that is constructed in a substantially planar manner. This contact-sensitive surface section 2a is free from electrical components 5a arranged thereon. In addition, the section 2a faces a planar section 4a' (cf. FIG. 3) of the shielding surface 4a of the housing 4, wherein electrical conductor tracks 6a and/or contacts 6b run along the contact-sensitive surface section 2a. A number of cured electrically non-conductive adhesive dots 7 is arranged on the contact-sensitive surface section 2a that is constructed in a substantially planar manner, which protrude from the contact-sensitive surface section 2a in the direction of the planar section 4a' of the shielding surface 4a of the housing 4 to ensure a minimum spacing between the contact-sensitive surface section 2a and the planar section 4a' of the shielding surface 4a of the housing 4. The minimum spacing may correspond to the height h of the adhesive dots 7, which is preferably between 0.05 mm and 0.4 mm, particularly between 0.1 mm and 0.25 mm (cf. FIG. 7). It may be provided that adjacent adhesive dots 7 are arranged at a desired spacing of between 1.5 mm and 8 mm, particularly between 2 mm and 6 mm, with respect to one another.

Figure 4:
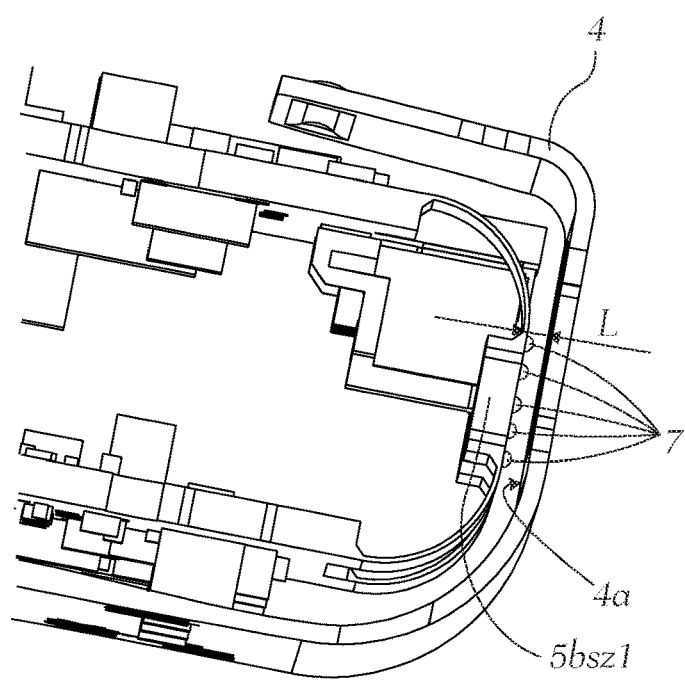
FIG. 4 shows a detailed view of the vehicle headlamp module according to FIGS. 1 to 3.

It can also be seen in FIG. 2, that the adhesive dots 7 are arranged in rows R and columns S (see also FIG. 5), wherein the number of rows R is between two and four and the number of columns S is between eight and sixteen. The circuit arrangement 2 is formed by a circuit substrate 5b and electrical components 5a arranged thereon. The contact-sensitive surface section 2a is formed by a surface section of the circuit substrate 5b, wherein the circuit substrate 5b is a semi-flex printed circuit board, which comprises at least three substantially rigid sections, namely two outer sections 5bsa1 and 5bsa2 and an intermediate section 5bsz1, and two flexible bending sections 5bf1 and 5bf2. The two outer sections 5bsa1 and 5bsa2 are connected to the intermediate section 5bsz1 by means of a flexible bending section 5bf1 and 5bf2 in each case. The adhesive dots 7 are arranged at least on the intermediate section 5bsz1 and can also furthermore be attached to the circuit substrate 2a. It can be seen well from FIG. 3 and FIG. 4 that the intermediate section 5bsz1 is arranged opposite the planar section 4a' of the shielding surface 4a of the housing 4. In particular, these two sections 5bsz1 and 4a' are arranged parallel to one another. It may be provided that spacing L between the contact-sensitive surface section 2a and the planar section 4a' of the shielding surface 4a is 5 mm maximum.

Figure 5:
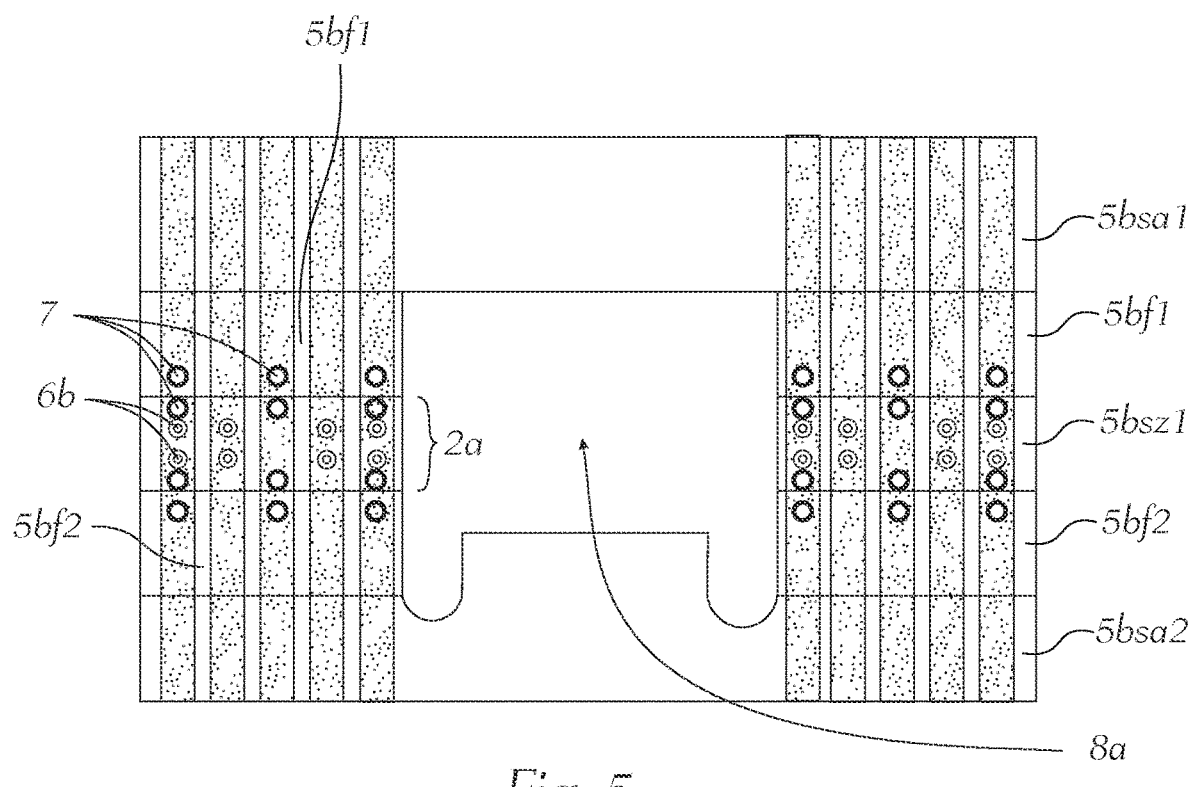
FIG. 5 shows a detailed view of a circuit arrangement of a vehicle headlamp module according to FIGS. 1 to 4 with adhesive dots arranged thereon, in a non-installed state.
Figure 6:
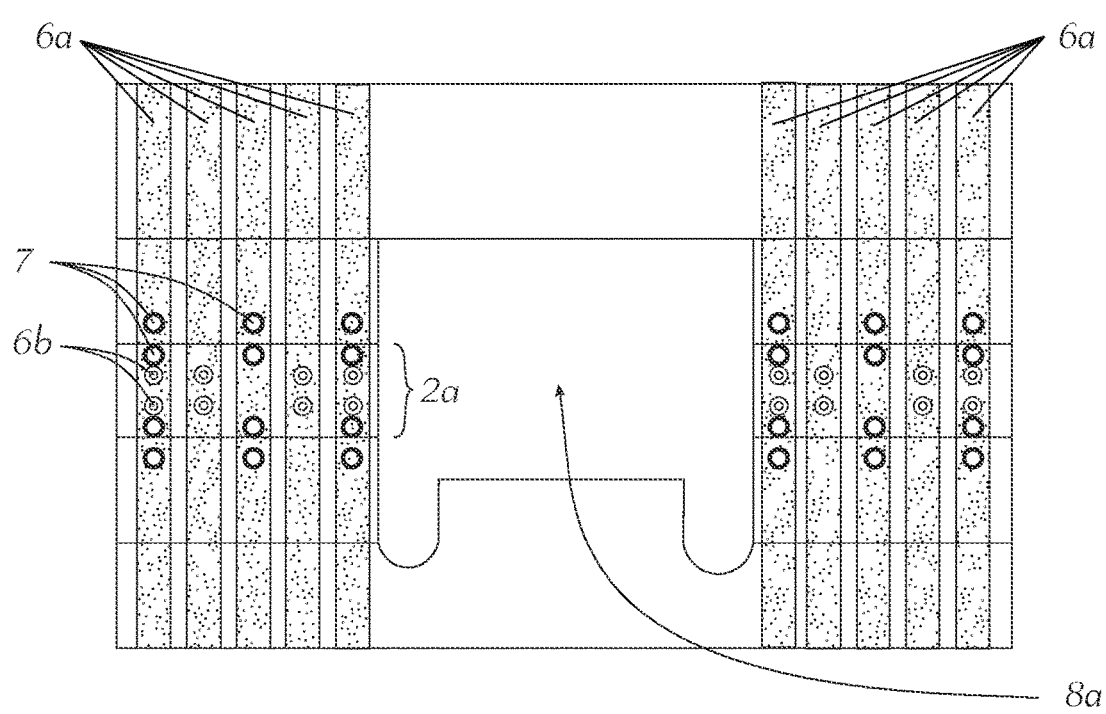
FIG. 6 shows a further detailed view of a circuit arrangement.

FIG. 5 shows a detailed view of a circuit arrangement 2 of a vehicle headlamp module 1 according to FIGS. 1 to 4 with adhesive dots 7 arranged thereon, in a non-installed unfolded state. It can be seen in the figure that an opening 8a (see also FIG. 2) is formed between the two outer sections 5bsa1, 5bsa2, which extends from the one outer section 5bsa1 to the other outer section 5bsa2. The opening 8a is delimited by the outer sections 5bsa1 and 5bsa2, the laterally adjoining regions of the intermediate section 5bsz1 and the two flexible bending sections 5bf1 and 5bf2. A further opening 8b is arranged in the shielding surface 4a of the housing 4, which overlaps at least partially with the opening 8a of the circuit substrate 5b.

With a view to FIG. 2, it is mentioned that the circuit substrate 5b additionally has a rigid additional outer section 5bsa3 and an additional flexible bending section 5bf3, using which the additional outer section 5bsa3 is connected (at least temporarily) in a flexible manner to one of the outer sections 5bsa2. In connection with the present invention, the expression "flexible" means that the relevant element is at least temporarily flexible and can be bent without being damaged in the process. In an extreme case, one-time damage-free bending is sufficient.

Figure 7:
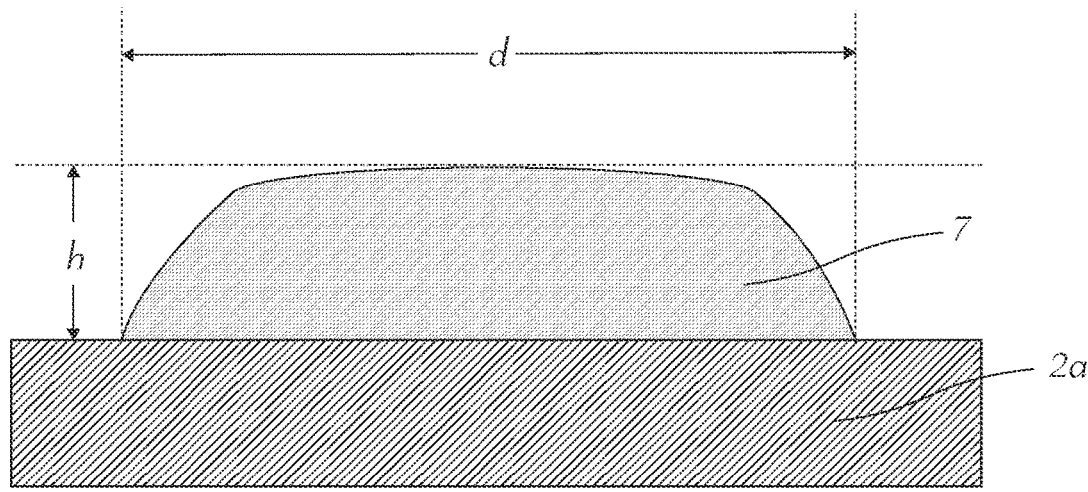
FIG. 7 shows a sectional illustration of a circuit substrate with an adhesive dot arranged thereon.

FIG. 7 shows a sectional illustration of a circuit substrate 2 with an adhesive dot 7 arranged thereon. The diameter d of the adhesive dots 7 in the contact area with the contact-sensitive surface section 2a is between 0.25 mm and 1.5 mm. It may be provided that the adhesive dots 7 consist of thermosetting adhesive material.

Figure 8:
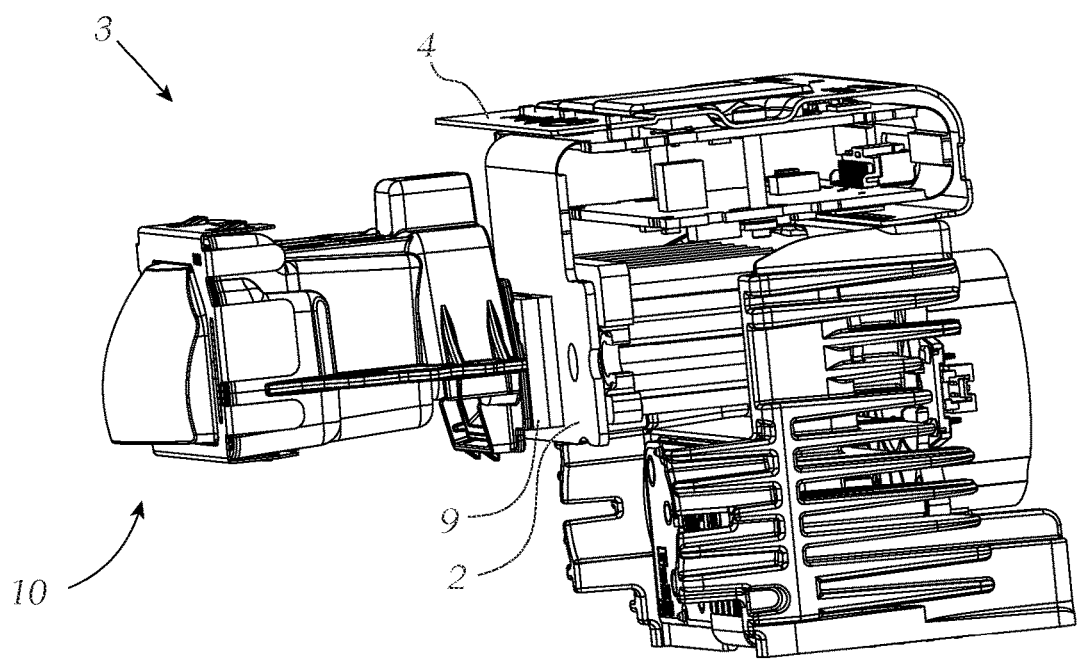
FIG. 8 shows a schematic illustration of a vehicle headlamp comprising a vehicle headlamp module according to the invention.

FIG. 8 shows a schematic illustration of a vehicle headlamp 3. The vehicle headlamp 3, particularly the motor vehicle headlamp, comprises a vehicle headlamp module 1 according to the invention and at least one optical projection system 10 for radiating a light distribution. The circuit arrangement 2 can comprise light sources 9, particularly LED light sources, for radiating light.

The invention is not limited to the embodiments shown, but rather defined by the entire protective scope of the claims. Also, individual aspects of the invention or the embodiments may be picked up and combined with one another. Any reference numbers in the claims are exemplary and used only for easier readability of the claims, without limiting the same.

The invention claimed is:

1. A vehicle headlamp module (1), comprising:
   an electrical circuit arrangement (2) for controlling at least one function of a vehicle headlamp (3); and
   a housing (4) for at least partially accommodating the electrical circuit arrangement (2), the housing (4) at least in certain sections having a metallic electrically conductive shielding surface (4a) facing the circuit arrangement (2) for electromagnetically shielding the circuit arrangement (2),
   wherein the electrical circuit arrangement (2) has at least one contact-sensitive surface section (2a) that is constructed in a substantially planar manner, this contact-sensitive surface section (2a) being free from electrical components (5a) arranged thereon and facing a planar section (4a') of the shielding surface (4a) of the housing (4), electrical conductor tracks (6a) and/or contacts (6b) running along the contact-sensitive surface section (2a), and
   wherein a number of cured electrically non-conductive adhesive dots (7) is arranged on the contact-sensitive surface section (2a) that is constructed in a substantially planar manner, which protrude from the contact-sensitive surface section (2a) in the direction of the planar section (4a') of the shielding surface (4a) of the housing (4) to ensure a minimum spacing between the contact-sensitive surface section (2a) and the planar section (4a') of the shielding surface (4a) of the housing (4).

2. The vehicle headlamp module (1) as claimed in claim 1, wherein adjacent adhesive dots (7) are arranged at a desired spacing of between 1.5 mm and 8 mm, particularly between 2 mm and 6 mm, with respect to one another.

3. The vehicle headlamp module (1) as claimed in claim 2, wherein the adhesive dots (7) are distributed substantially uniformly along the contact-sensitive surface section (2a), in that each imaginary circular unit area of the contact-sensitive surface section (2a), which has a diameter amounting to the maximum value of the desired spacing, has at least one adhesive dot (7).

4. The vehicle headlamp module (1), as claimed in claim 1, wherein the adhesive dots (7) are arranged in rows (R) and columns (S), wherein the number of rows (R) is between two and four and the number of columns (S) is between eight and sixteen.

5. The vehicle headlamp module (1) as claimed in claim 1, wherein the height (h) of the adhesive dots (7) is between 0.05 mm and 0.4 mm, particularly between 0.1 mm and 0.25 mm.

6. The vehicle headlamp module (1) as claimed in claim 1, wherein the diameter (d) of the adhesive dots (7) in the contact area with the contact-sensitive surface section (2a) is between 0.25 mm and 1.5 mm.

7. The vehicle headlamp module (1) as claimed in claim 1, wherein the adhesive dots (7) consist of thermosetting adhesive material.

8. The vehicle headlamp module (1) as claimed in claim 1, wherein the circuit arrangement (2) is formed by a circuit substrate (5b) and electrical components (5a) arranged thereon, wherein the contact-sensitive surface section (2a) is formed by a surface section of the circuit substrate (5b), wherein the circuit substrate (5b) is a semi-flex printed circuit board, which comprises at least three substantially rigid sections, namely two outer sections (5bsa1, 5bsa2) and an intermediate section (5bsz1), and two flexible bending sections (5bf1, 5bf2), wherein the two outer sections (5bsa1, 5bsa2) are connected to the intermediate section (5bsz1) by means of a flexible bending section (5bf1, 5bf2) in each case, wherein the adhesive dots (7) are arranged at least on the intermediate section (5bsz1).

9. The vehicle headlamp module (1) as claimed in claim 8, wherein at least the intermediate section (5bsz1) is arranged opposite the planar section (4a') of the shielding surface (4a) of the housing (4).

10. The vehicle headlamp module (1) as claimed in claim 8, wherein an opening (8a) is formed between the two outer sections (5bsa1, 5bsa2), which extends from the one outer section (5bsa1) to the other outer section (5bsa2), wherein the opening (8a) is delimited by the outer sections (5bsa1, 5bsa2) and laterally adjoining region of the intermediate section (5bsz1) and the two flexible bending sections (5bf1, 5bf2), wherein a further opening (8b) is arranged in the shielding surface (4a) of the housing (4), which overlaps at least partially with the opening (8a) of the circuit substrate (5b).

11. The vehicle headlamp module (1) as claimed in claim 1, wherein the circuit substrate (5b) additionally has a rigid additional outer section (5bsa3) and an additional flexible bending section (5bf3), using which the additional outer section (5bsa3) is connected in a flexible manner to one of the outer sections (5bsa2).

12. The vehicle headlamp module (1) as claimed in claim 1, wherein the circuit arrangement (2) comprises light sources (9), particularly LED light sources, for radiating light.

13. The vehicle headlamp module (1) as claimed in claim 1, wherein the contact-sensitive surface section (2a) and the planar section (4a') of the shielding surface (4a) are oriented parallel to one another.

14. The vehicle headlamp module (1) as claimed in claim 1, wherein the spacing (L) between the contact-sensitive surface section (2a) and the planar section (4a') of the shielding surface (4a) is 5 mm maximum.

15. A vehicle headlamp (3), particularly a motor vehicle headlamp, comprising:
   a vehicle headlamp module (1) as claimed in claim 1; and
   at least one optical projection system (10) for radiating a light distribution.

\* \* \* \* \*